(12) United States Patent
Takahashi et al.

(10) Patent No.: US 6,480,226 B1
(45) Date of Patent: *Nov. 12, 2002

(54) IMAGE PICKUP APPARATUS HAVING GRADATION CONTROL FUNCTION FOR PROVIDING IMAGE SIGNALS DEFINITIVE OF BACKLIGHTED OBJECTS

(75) Inventors: Koji Takahashi, Kanagawa-ken (JP); Kenji Kyuma, Saitama-ken (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/423,903

(22) Filed: Apr. 18, 1995

(30) Foreign Application Priority Data

Apr. 25, 1994 (JP) .............................. 6-086721

(51) Int. Cl.⁷ ........................ H04N 3/14; H04N 5/238
(52) U.S. Cl. .................... 348/296; 348/229.1; 348/279; 348/317; 348/364
(58) Field of Search ................................ 348/294, 296, 348/297, 298, 362, 363, 364, 365, 207, 229, 230, 299, 311, 312, 366; 354/410, 429; H04N 5/335

(56) References Cited

U.S. PATENT DOCUMENTS

| 4,427,996 A | * | 1/1984 | Tamura ....................... 358/228 |
| 4,647,975 A | * | 3/1987 | Alston et al. ................ 358/213 |
| 4,825,291 A | * | 4/1989 | Mimura et al. ......... 358/213.19 |
| 5,040,068 A | * | 8/1991 | Parulski et al. ............. 358/209 |
| 5,117,292 A | * | 5/1992 | Matsunaga ............. 358/213.19 |
| 5,162,914 A | * | 11/1992 | Takahashi et al. ...... 358/213.19 |
| 5,223,935 A | * | 6/1993 | Tsuji et al. .................. 358/228 |
| 5,335,075 A | * | 8/1994 | Komiya et al. .............. 348/298 |
| 5,382,974 A | * | 1/1995 | Soeda et al. ................. 348/221 |
| 5,420,635 A | * | 5/1995 | Konishi et al. .............. 348/362 |
| 5,438,365 A | * | 8/1995 | Yamashita ................... 349/312 |
| 5,463,421 A | * | 10/1995 | Deguchi ...................... 348/296 |
| 5,488,416 A | * | 1/1996 | Kyuma ........................ 348/296 |
| 5,515,132 A | * | 5/1996 | Iwasaki ....................... 384/432 |
| 5,526,088 A | * | 6/1996 | Kusaka ........................ 354/402 |
| 5,621,462 A | * | 4/1997 | Takahashi .................... 348/363 |
| 5,677,733 A | * | 10/1997 | Yoshimura et al. ......... 348/362 |
| 5,703,644 A | * | 12/1997 | Mori et al. .................. 348/363 |
| 5,969,761 A | * | 10/1999 | Takahashi .................... 348/362 |

* cited by examiner

Primary Examiner—Ngoc-Yen Vu
(74) Attorney, Agent, or Firm—Robin, Blecker & Daley

(57) ABSTRACT

An image pickup apparatus which can produce an image provided with exposure suitable for both a backlighted object and its background without requiring a mechanical member, such as an iris or the like. The image pickup apparatus has a photoelectric conversion section for photoelectrically converting a light image so as to accumulate light information and to output the light information every unit light accumulation period which forms one picture. A digital camera signal processing circuit processes an output from the photoelectric conversion section to output a video signal. A timing signal generator outputs a plurality of timing signals for setting light information accumulation time every unit light accumulation period which is set in the photoelectric conversion section. An image analyzing circuit selects one of the timing signals output from the timing signal generator correspondingly with higher luminance and lower luminance regions based on luminance information from the digital camera signal processing circuit and inputs the selected timing signal into the photoelectric conversion section.

7 Claims, 15 Drawing Sheets

| 01 | 02 | 03 | 04 | 05 | 06 | 07 | 08 |
|----|----|----|----|----|----|----|----|
| 09 | 10 | 11 | 12 | 13 | 14 | 15 | 16 |
| 17 | 18 | 19 | 20 | 21 | 22 | 23 | 24 |
| 25 | 26 | 27 | 28 | 29 | 30 | 31 | 32 |
| 33 | 34 | 35 | 36 | 37 | 38 | 39 | 40 |
| 41 | 42 | 43 | 44 | 45 | 46 | 47 | 48 |
| 49 | 50 | 51 | 52 | 53 | 54 | 55 | 56 |
| 57 | 58 | 59 | 60 | 61 | 62 | 63 | 64 |

F I G. 16
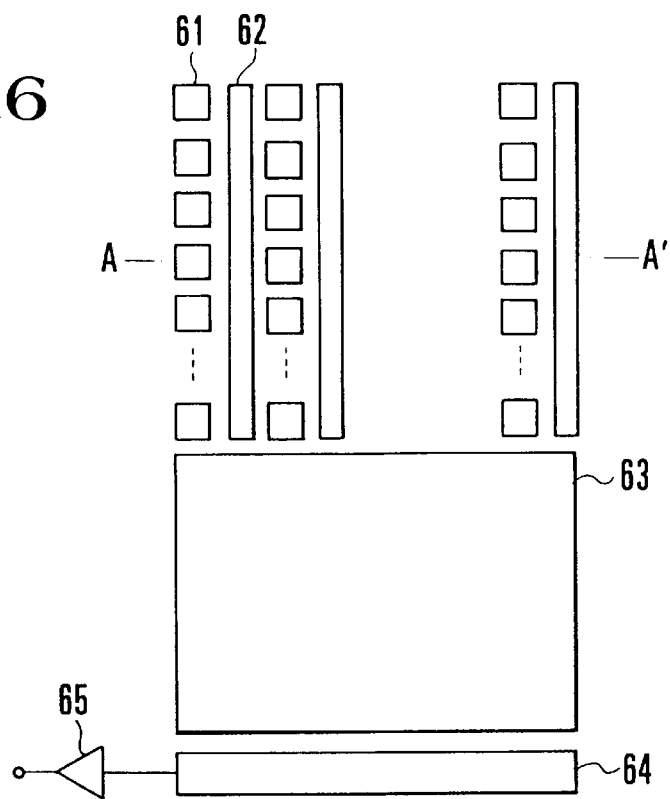
F I G. 17
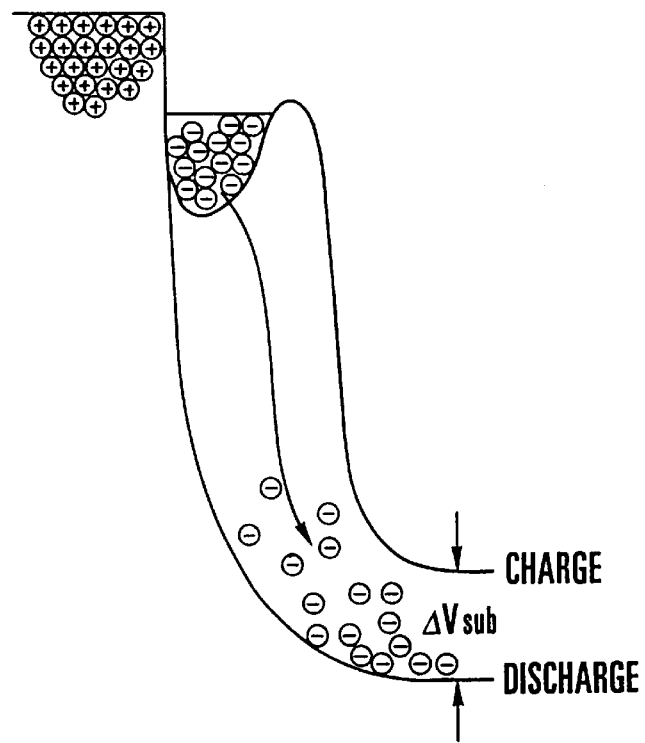

IMAGE PICKUP APPARATUS HAVING GRADATION CONTROL FUNCTION FOR PROVIDING IMAGE SIGNALS DEFINITIVE OF BACKLIGHTED OBJECTS

BACKGROUND OF THE INVENTION

1. Field of the Invention

This invention relates to an image pickup apparatus having a gradation control function suitable for performing image pickup of a backlighted object.

2. Description of the Related Art

It is inevitable that a wide range of gradations in one picture be produced for picking up by use of a video camera or the like an image of a backlighted object in which illuminance of the backlighting is intense.

An image pickup apparatus provided with a solid image pickup element for use in a video camera or the like does not possess a wide dynamic range in such a degree as to entirely convert such wide gradations to video signals. This causes clipping in the respective higher and lower levels of illuminance, which is referred to as "white compression" and "black compression" respectively in which excessively bright and dark portions cannot be expressed in gradations.

In particular, when image pickup is performed on a backlighted object, the main object becomes darkly shaded in contrast to the bright background, thus causing "black compression".

In order to deal with such inconveniences, a BLC (backlight control) method is conventionally employed whereby exposure is increased to perform backlight compensation. The backlight compensation will now be explained in detail.

A description will first be given of the operation of the BLC for use with an exposure control mechanism using an iris with reference to a diagram of a backlight compensation circuit shown in FIG. 22.

An incident beam from an object through an optical system 10 is controlled by an iris 11 to result in suitable light quantity so that an image is formed on an image pickup element 12. A photoelectric conversion signal according to the formed image is output from the image pickup element 12 and is further converted into a video signal in a signal processing circuit 13 so as to be output.

Meanwhile, the above-described video signal is supplied to an automatic exposure control circuit (hereinafter referred to as "the AE circuit") 14 which thus generates an iris control signal according to the video signal. A driver 16 receives the iris control signal from the AE circuit 14 via an adder 15 so as to generate a drive signal for driving an ig meter 17, thereby realizing automatic control of the light quantity by use of the iris 11.

The above-described automatic light quantity control is generally based on a principle that the light quantity is controlled according to the integral of different luminance levels of a video signal for one picture. Thus, control is performed in such a way that attention is paid only to the average illuminance in the overall picture. Hence, in performing image pickup of a backlighted object, the incident light to be input into the image pickup element 12 is controlled so that it can be suitable for a very bright background, and accordingly, a main object becomes extremely dark, which thus incurs "black compression" in the main object.

In order to deal with such a problem, a user for a video camera or the like is required to turn a BLC switch 19 ON to provide an instruction for performing backlight compensation. In the circuit diagram shown in FIG. 22, the BLC switch 19 is turned ON so as to transmit a signal instructing the iris 11 to "open" to the driver 16 via the adder 15 from a compensation signal generator 18. The driver 16 drives the ig meter 17 to open so as to increase the amount of incident light to be input into the image pickup element 12, thus performing backlight compensation.

Backlight compensation performed by the conventional method is thus achieved by switching the BLC switch 19 ON, which transforms a resultant image from the state of BLC-OFF (before backlight compensation) shown in FIG. 3 to the state of BLC-ON (after backlight compensation) illustrated in FIG. 4. FIG. 3 clearly shows that in the BLC-OFF state the background is well presented, while the main object (the signpost of Mt. Fuji) is not presented very well, suffering from "black compression". In contrast, FIG. 4. shows that in the BLC-ON state the main object is magnificently presented in full expression in all of its gradations.

However, as is seen from FIG. 4, the image pickup apparatus of the above conventional type performs backlight compensation to increase the light quantity by the image pickup element so as to make the main object presentable but also to disadvantageously give rise to "white compression" in the background.

In other words, since an image pickup element used in the conventional image pickup apparatus has a restricted dynamic range, the above-described light compensation method for use with such an apparatus presents a problem in that clipping occurs in either of the higher or lower level of illuminance, and it is thus impossible to perform the operation of good image pickup to make both the main object and the background presentable.

SUMMARY OF THE INVENTION

This invention aims to solve the above stated problems of the image pickup apparatus of the prior art.

It is, therefore, an object of this invention to provide an image pickup apparatus having a gradation control function which can bring about good exposure for both a main object and its background so as to express a wide range of gradations.

In order to achieve the above object, the present invention provides an image pickup apparatus having a gradation control function, comprising: photoelectric conversion means for photoelectrically converting a light image so as to accumulate light information and to output the light information every unit light accumulation period which forms one picture; signal processing means for processing an output from the photoelectric conversion means to output a video signal; timing means for outputting a plurality of timing signals for setting light information accumulation time every unit light accumulation period which is set in the photoelectric conversion means; and gradation control means for controlling selection of the plurality of timing signals output from the timing means correspondingly with higher luminance and lower luminance regions based on luminance information from the signal processing means, and for inputting the selected timing signal into the photoelectric conversion means.

The present invention also provides an image pickup apparatus having a gradation control function, comprising: photoelectric conversion means for photoelectrically converting a light image so as to accumulate light information and to output the light information every unit light accumulation period which forms one picture; signal processing means for processing an output from the photoelectric conversion means to output a video signal; timing means for outputting a plurality of timing signals for setting light information accumulation time every unit light accumulation period which is set in the photoelectric conversion means; and gradation control means for controlling selection of the plurality of timing signals output from the timing means based on luminance information which is input from the signal processing means every unit light accumulation period which is set in the photoelectric conversion means, and for inputting the selected timing signal into the photoelectric conversion means.

With this arrangement, the image pickup apparatus having a gradation control function according to the present invention performs the following operations. That is, by every unit light accumulation period, light information accumulation time is set longer to achieve exposure suitable for lower luminance object, while it is set shorter to bring about exposure suitable for higher luminance object, based on image information about the respective objects. Thus, the apparatus respectively controls the light information accumulation time so as to accomplish exposure suitable for both higher and lower luminance objects without using mechanical light quantity control means, such as an iris or the like.

The above and other objects and features of the invention will become apparent from the following detailed description of embodiments thereof taken in connection with the accompanying drawings.

BRIEF DESCRIPTION OF THE DRAWINGS

FIG. 16 illustrates the construction of an FIT-type CCD.

FIG. 17 illustrates the discharging operation by the VOD-type CCD.

DETAILED DESCRIPTION OF THE PREFERRED EMBODIMENTS

A description will now be given of embodiments of an image pickup apparatus having a gradation control function according to the present invention.

Figure 1:
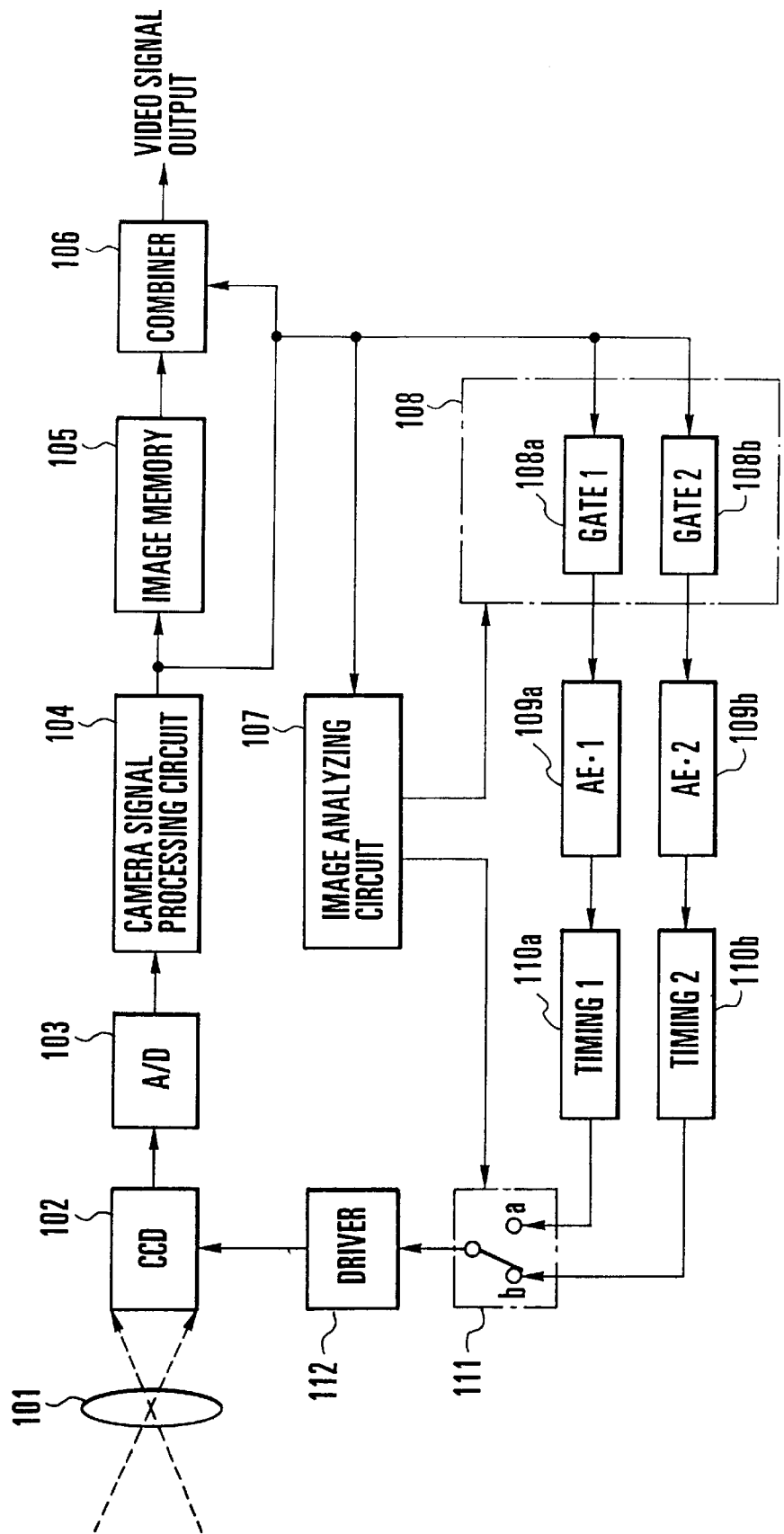
FIG. 1 is a block diagram illustrative of one embodiment of the present invention.

One embodiment of the present invention will now be explained with reference to FIG. 1. FIG. 1 is a block diagram illustrative of an image pickup apparatus according to one embodiment of the present invention.

Incident light from an object passes through a lens 101 so that an image is formed on photoelectric conversion means (CCD) 102 having an image pickup element for performing photoelectric conversion. An output resulting from the photoelectric conversion is converted into a digital signal in an A/D converter 103 and is further processed into a video signal in a digital camera signal processing circuit 104.

The video signal output is stored in an image memory 105 picture by picture. A picture defined herein corresponds to a field (262.5 horizontal scanning lines according to NTSC), or to a frame (525 horizontal scanning lines according to NTSC) when it is desired that a deterioration in vertical resolution be inhibited. An output from the image memory 105 is combined with the output from the camera signal processing circuit 104 in a combiner 106 so that the combined output has a time lag exactly equal to one picture (1/60 seconds according to NTSC). The combined video signal is thus output from the combiner 106.

Below-mentioned AE (automatic exposure control) means functions so that the above-described signal system can express gradations most effectively.

Two types of AE systems are controlled in an image analyzing circuit 107 based on luminance information output from the camera signal processing circuit 104.

One type of AE system is a bright AE circuit comprising a gate 108a, a control signal generator 109a and a timing signal generator 110a for setting light accumulation time. The other type is a dark AE circuit comprising a gate 108b, a control signal generator 109b and a timing signal generator 110b for setting light accumulation time.

The image analyzing circuit 107 controls in such a manner that the respective timing signals are switched in a switching circuit 111 in which two types of bright and dark light accumulation time are set at terminals "a" and "b", respectively. The selected accumulation time is supplied to the CCD 102 via a CCD driver 112 so that the optimal shutter speed (light accumulation time) can be set, thereby accomplishing the extension of the dynamic range of the overall image pickup system.

A description will further be given of the image pickup element 102 controlled by the driver 112.

Many types of image pickup elements, such as CCD, MOS, BASIS and the like are available based on the principle of photoelectric conversion. An explanation will be given of CCD, as the image pickup element by way of example, which is currently most generally used in a video camera.

The CCD can be classified in terms of a semiconductor structure by electrical charge read-out methods, such as FT (frame transfer) type, IT (interline transfer) type, FIT (frame interline transfer) type and the like, or by the discharging of unnecessary electrical charge, such as VOD (vertical overflow drain) type and the like.

An explanation will first be given of the basic structure of the interline transfer type (IT type) and also of the operation of a high-speed shutter using such an IT-type CCD, which is one of the basic operations of the CCD.

Figure 14A:
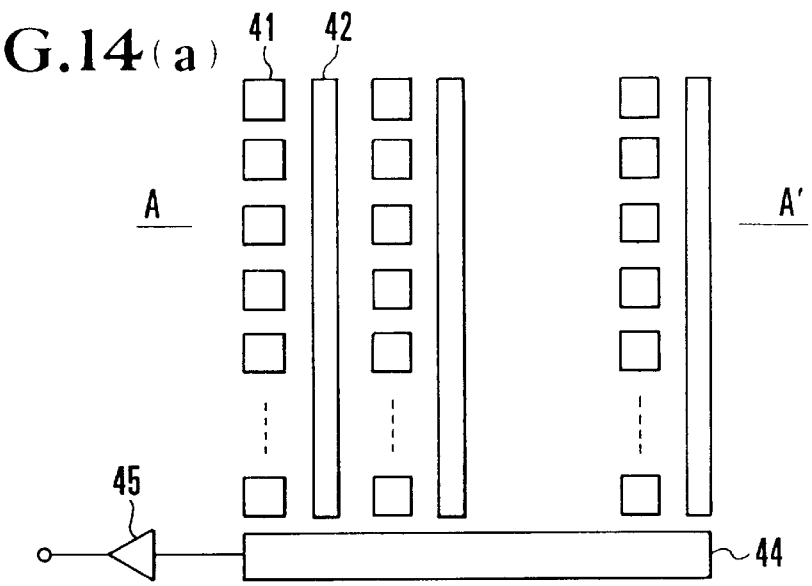
FIGS. 14(a) and 14(b) illustrate the construction of an IT-type CCD.
Figure 14B:
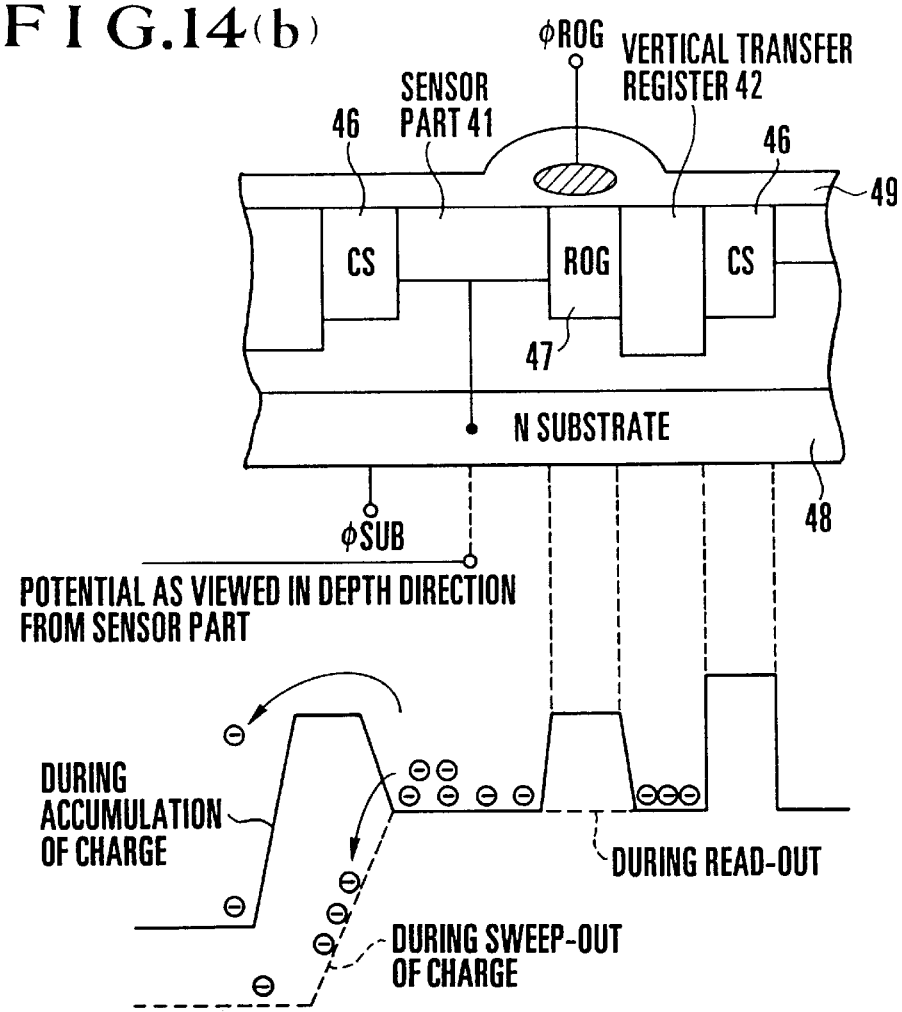

FIG. 14(a) is a schematic view of an interline transfer-type (IT-type) CCD, which comprises a sensor part 41 (sensing means) for performing photoelectric conversion, a vertical transfer register 42, a horizontal transfer register 44 and an output amplifier 45. FIG. 14(b) is a cross sectional view along A–A' line of FIG. 14(a) and also illustrates the electrical potential as viewed in the depth direction from the sensor part.

FIG. 14(b) shows a pixel separation channel stop (CS) 46, a read-out gate (ROG) 47 for transferring charges accumulated in the sensor part 41 to the vertical transfer register 42, a substrate 48 and an oxide film 49.

Figure 15:
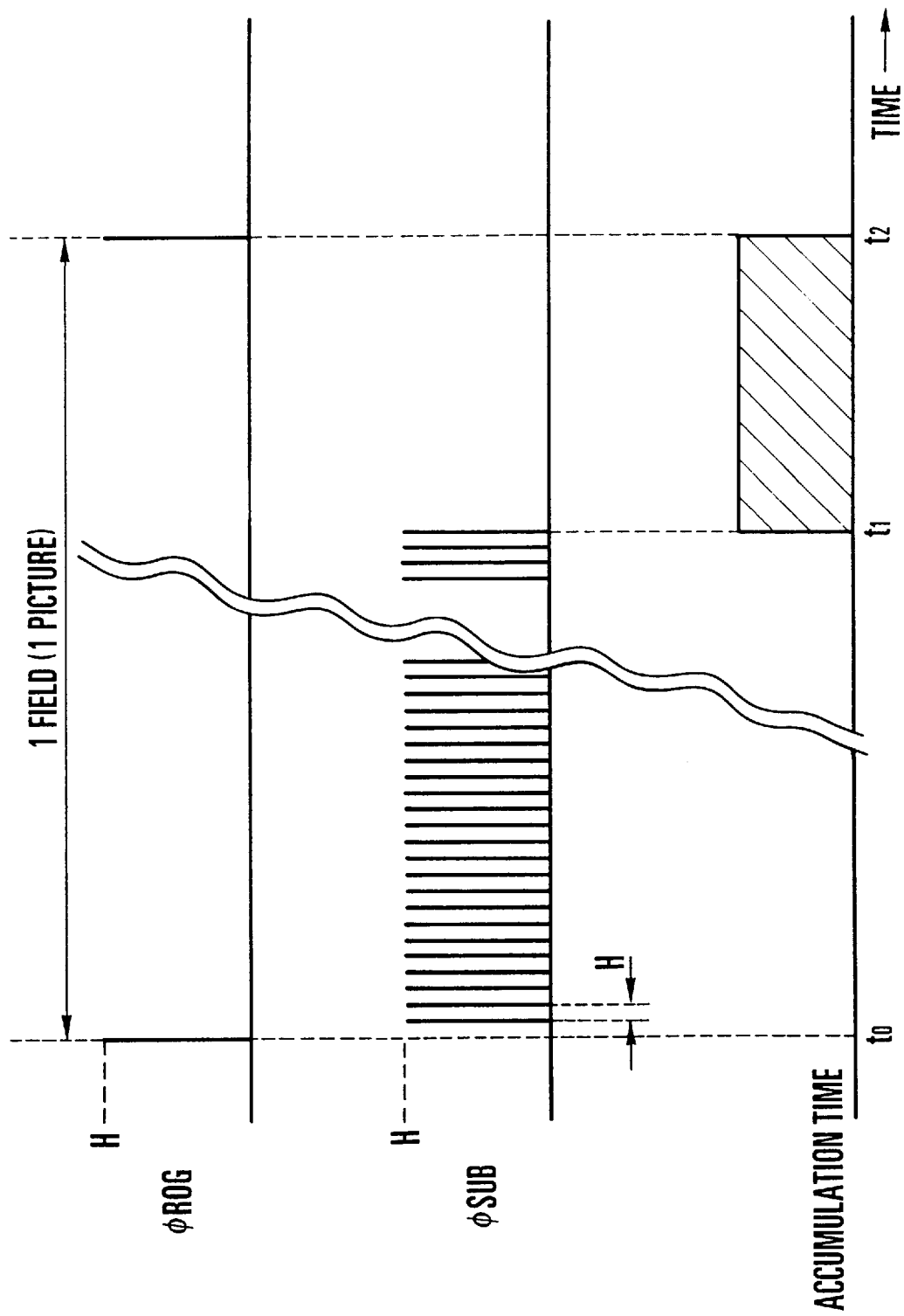
FIG. 15 is a timing chart of the IT-type CCD.

The operation of the high-speed shutter will be explained with reference to FIGS. 14(a), 14(b) and 15. FIG. 15 is a timing chart illustrative of a standard television signal for one field (for example, approximately 1/60 seconds according to NTSC). A pulse indicated by φROG is applied to the read-out gate 47. When the logic level is at "H", the potential of the read-out gate 47 is lowered, and thus, charges accumulated in the sensor 41 are transferred to the vertical transfer register 42. A discharging pulse indicated by φSUB is applied to the substrate 48. When the logic level is at "H", charges accumulated in the sensor part 41 are swept out to the exterior via the φSUB terminal, thus performing discharging.

In this embodiment, FIG. 15 shows that the φROG pulse is applied during the vertical retrace period, while the φSUB pulse is applied during the horizontal retrace period. After charges accumulated in the sensor part 41 are read out at the time t0, a subsequent period starts. However, since the φSUB pulse reaches the "H" level at the time t1 during the horizontal retrace period, there is no charge which has been stored during a period from the time t0 to t1 in the sensor part 41. Since the φSUB pulse remains at "L" level during a period from the time t1 to t2, charges are accumulated in the sensor part 41. They are further transferred to the vertical transfer register 42 when the pulse φROG becomes at "H" level at the time t2. The accumulation time, in other words, the exposure time, thus results in the time indicated by (t2−t1).

The operation of the IT-type CCD high-speed shutter can be accomplished as described above.

An explanation will further be given of the operation of the frame interline transfer-type (FIT-type) CCD.

FIG. 16 is a schematic view illustrative of a frame interline transfer-type (FIT-type) CCD. The CCD of this type differs from the IT-type CCD shown in FIG. 14(a) in that it has a storage part 63. The number of storage cells in the storage part 63 coincides with that of cells of a sensor part (sensing means) 61. After charges from the sensor part 61 are transferred to a vertical transfer register 62, they are transferred to the storage part 63 during the vertical retrace period and further to a horizontal transfer register 64 at a predetermined timing. The charges then pass through an output amplifier 65 and finally are read out.

A cross sectional view along A–A' line of FIG. 16 and the potential as viewed in the depth direction from the sensor part 61 can be illustrated in a manner similar to FIG. 14(b). A charge sweep-out mechanism and a mechanism for reading out the charge from the sensor part 61 to the vertical transfer register 62 are similar to those shown in FIG. 14(b). The operation of the FIT-type CCD is thus accomplished.

Figure 13:
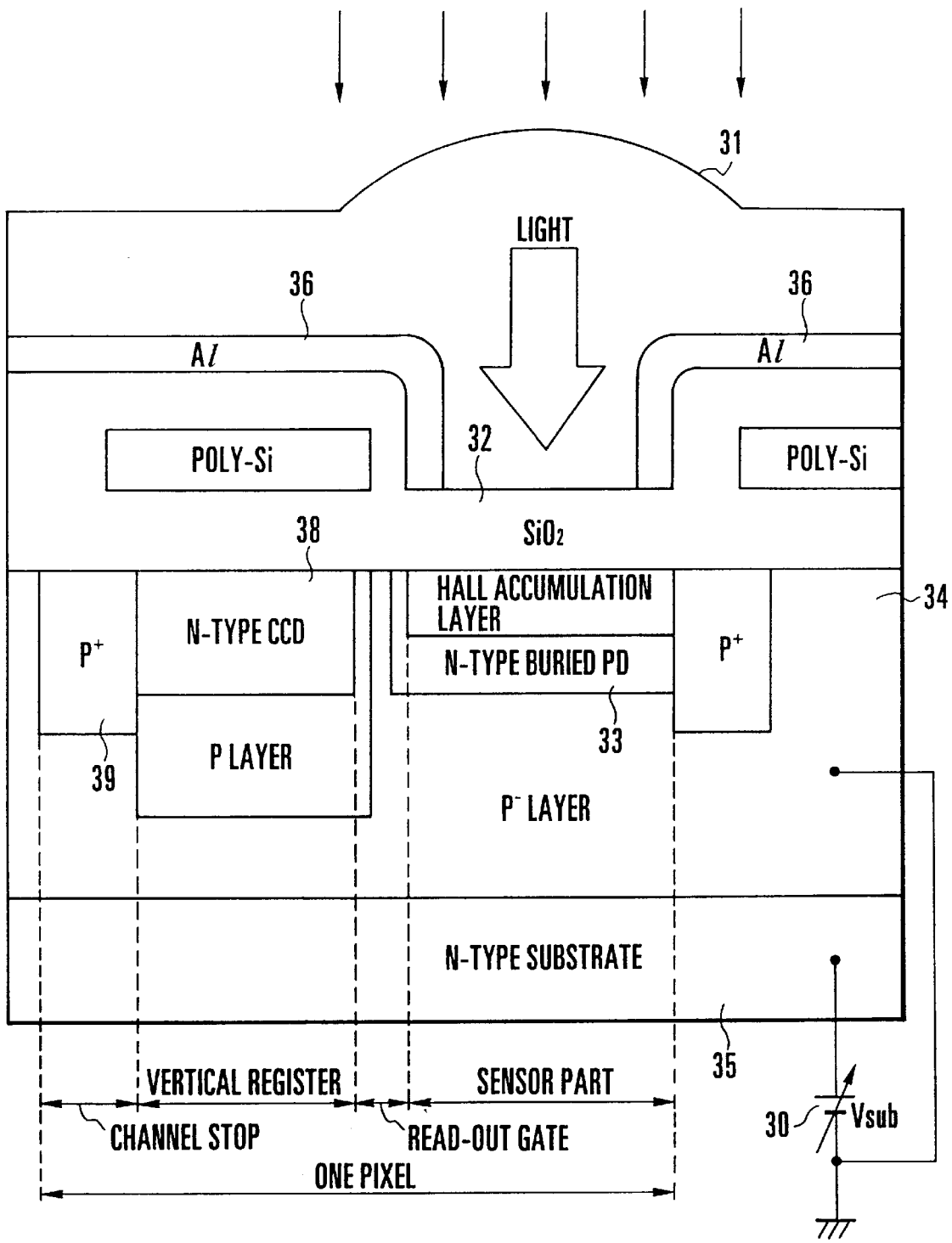
FIG. 13 illustrates the construction of a VOD-type CCD image sensor.

A description will now be given of the operation of a VOD-type CCD image sensor shown in FIG. 13. The light from an object indicated by the arrows shown in the upper part of FIG. 13 is received by a photodiode (PD) of a sensor part 33 via an oxide ($SiO_2$) layer 32 and a Hall accumulation layer used for compensating for a decrease in the dark current. Aluminum (Al) layers 36 are disposed to shield the light not to be incident on the portions other than the sensor part 33. Such light shielding inhibits the effective utilization of the light-receiving area of the CCD, resulting in a decrease in the aperture efficiency. In this embodiment, a condenser lens 31 is provided for each pixel to compensate for a decrease in the aperture efficiency.

Charges generated by the photoelectric conversion are shifted to a vertical transfer V-CCD (vertical transfer register) 38 and are sequentially transferred in the two-dimensional plane so as to be output as a voltage value by a read-out amplifier.

A channel stop 39 is provided for each pixel so that the charge generated in each pixel can be separated therein not to be mixed into other elements. A P layer 34 and an N-SUB layer 35 are disposed below the sensor part 33. A substrate biasing potential Vsub 30 is applied to both of the above-mentioned layers 34 and 35 so as to eliminate unnecessary charges.

FIG. 17 is a schematic view illustrative of the discharge operation of the VOD-type CCD indicated in terms of the potential. The line marked with "CHARGE" illustrates the potential obtained when optical charges are accumulated, while the line marked with "DISCHARGE" illustrates the potential obtained when unnecessary charges are eliminated. In the state of "CHARGE", charges are accumulated in a recess shown in the upper portion of FIG. 17. On the other hand, in the state of "DISCHARGE", ΔVsub is further applied to the substrate biasing potential Vsub. With this resultant total potential indicated by Vsub+ΔVsub, the above-described recess is eliminated to discharge the accumulated charges downward.

It should be noted that the P layer shown in FIG. 13 is disposed below the N-type V-CCD layer so as to avoid during discharge the accidental entry of unnecessary charges requiring long recombination time into the vertical transfer register 38 as noise.

Figures 18A, 18B, 18C:
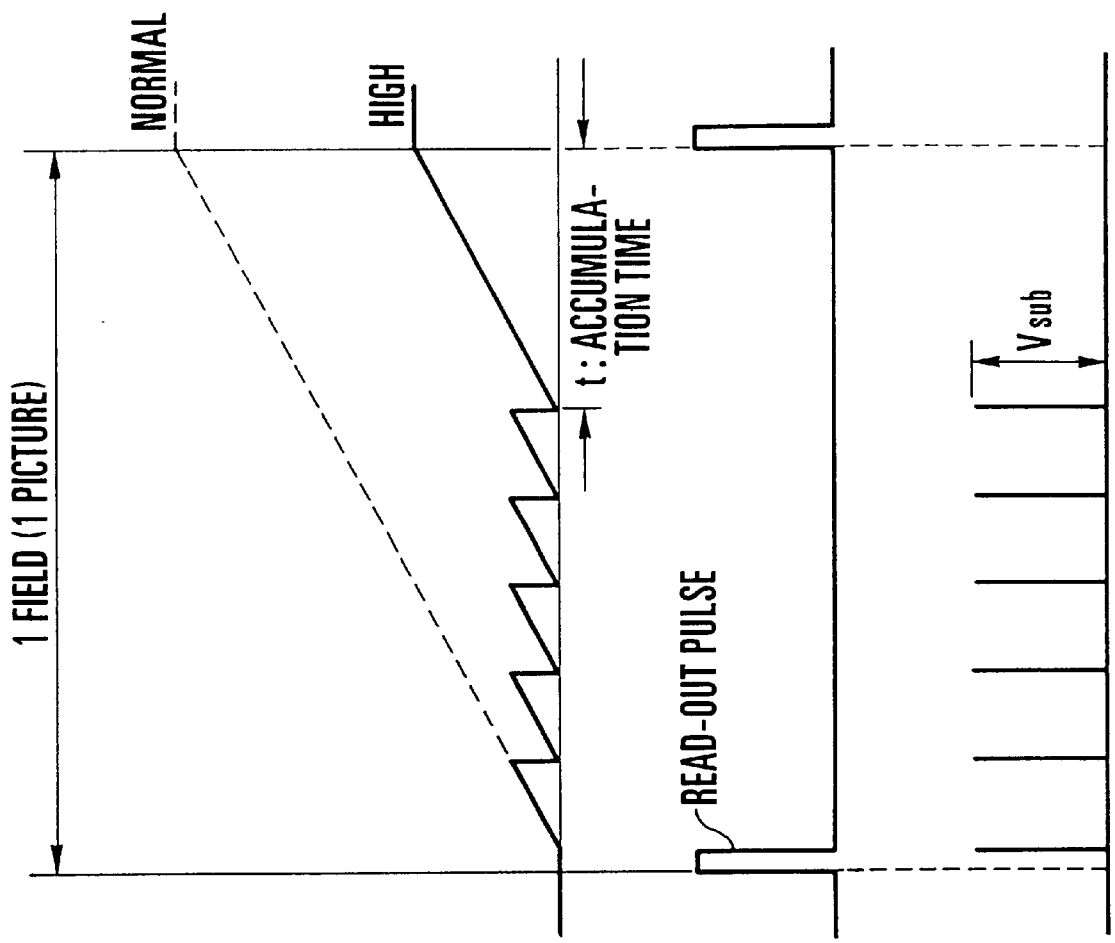
FIGS. 18(a), 18(b) and 18(c) illustrate the timing of the operation of the high-speed shutter by the VOD-type CCD.

FIGS. 18(a)–18(c) illustrate a timing chart of a change in the potential Vsub during the operation of the above-described high-speed shutter. As shown in FIG. 18(c), during one field period of a standard television signal, the potential Vsub is first varied in a pulsating manner at a predetermined time interval so that the unnecessary charges accumulated in the sensor part 61 can be eliminated until a predetermined time is reached. Thereafter, the charge accumulation is performed for the time t in the latter part of one field period (one picture), and a read-out pulse shown in FIG. 18(b) is applied to read out the accumulated charges indicated by "HIGH" as image information, thereby producing the effect of a high-speed shutter obtained by performing charge accumulation for the time t. FIG. 18(a) illustrates a difference between the types of charge accumulation in which the normal type of accumulation is indicated by "NORMAL" and the particular type of accumulation performed during the operation of the high-speed shutter is represented by "HIGH".

It will now be assumed that a television signal according to the NTSC method is employed to obtain t1+t2=1/60 seconds. Thus, in FIG. 15, when t2 equals 1/500 seconds, t1 can be expressed by 1/60–1/500≈1/60 seconds.

Considering that it is typical that the stages of the exposure of a camera, such as 1/60 seconds, 1/125 seconds, 1/250 seconds and 1/500 seconds each correspond to one step in terms of a stop, the above-described calculations show that the correct exposure can be achieved at the time t2 for an object having higher luminance by three stops compared to an object provided with the correct exposure at the time t1.

Figure 2:
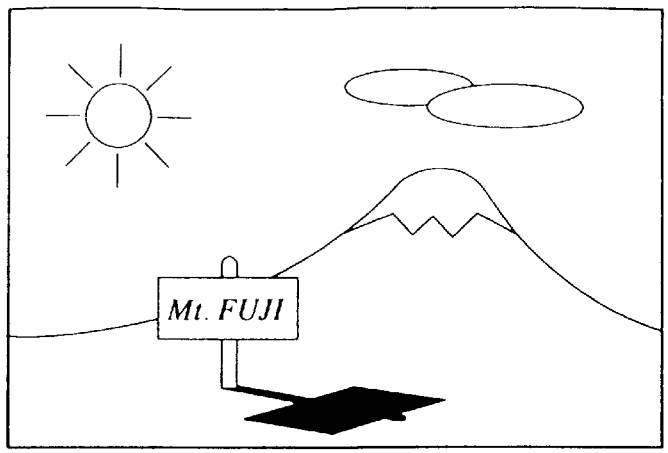
FIG. 2 illustrates an image obtained when image pickup is performed on the backlighted object according to the same embodiment of the present invention.
Figure 3:
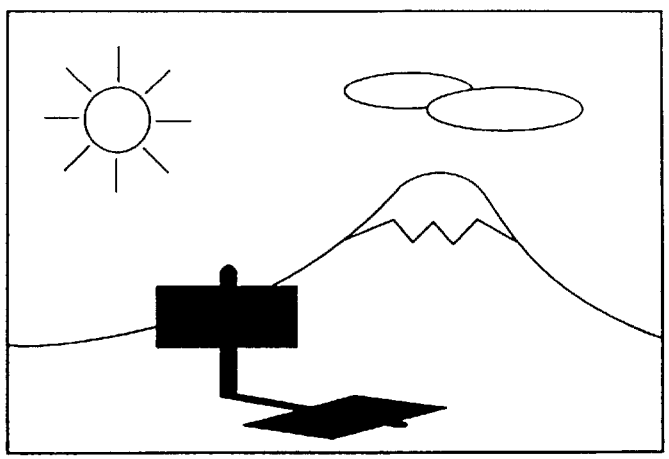
FIG. 3 illustrates an image suffering from "black compression" before conventional backlight compensation is made.
Figure 4:
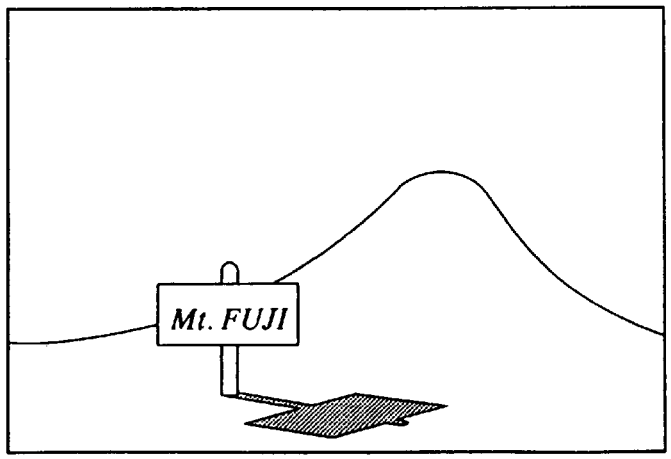
FIG. 4 illustrates an image suffering from "white compression" after conventional backlight compensation has been made.

Suppose that there is a difference in luminance by three stops between a backlighted main object and its background. This difference produces a resultant picture at the time t1 equivalent to that obtained in the state of BLC-ON (after performing backlight compensation) which has been discussed in the related art. That is, although correct exposure is provided for the main object, clipping occurs in the background due to its higher luminance. On the other hand, the above-described difference in the luminance produces a resultant picture at the time t2 equivalent to that in the state of BLC-OFF (before performing backlight compensation) which has been discussed in the related art. That is, correct exposure is provided for the background having higher luminance than the main object by three stops, and accordingly, image pickup is hardly conducted on the main object. The information on charges accumulated at the time t1 and those at the time t2 is added per pixel by the combiner via the image memory, resulting in a picture magnificently presenting both the backlighted main object (the signpost of Mt. Fuji) and the background in the bright sunlight, as illustrated in FIG. 2.

Figure 7:
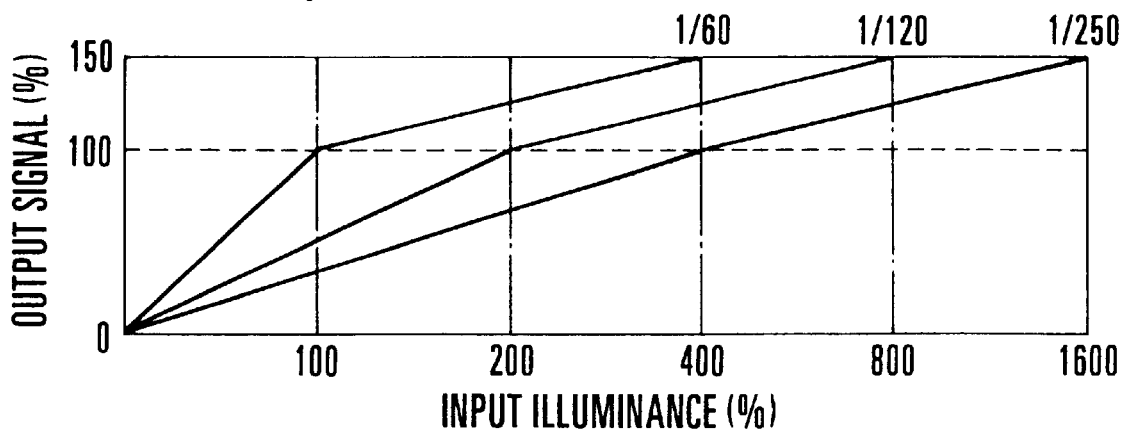
FIG. 7 illustrates compression characteristics of an output signal with respect to input illuminance by a high-speed shutter.

FIG. 7 is a diagram illustrative of the output signal in relation to the input illuminance when the light accumulation is performed using a high-speed shutter (at a speed of 1/120 seconds and 1/250 seconds, which are represented by way of example) and at a speed of 1/60 seconds, which is a typical NTSC field rate.

At 1/60 seconds, the input illuminance and the output signal are related linearly so that 100% input directly brings about 100% output, and for input in excess of 100%, the output in relation to the input is nonlinearly compressed so that the input from 100 to 400% corresponds to the output from 100 to 150%, respectively.

At 1/120 seconds, the output signal in relation to the input illuminance is compressed so that 200% input brings about 100% output and the input from 200 to 800% produces the output from 100 to 150%, respectively.

At 1/250 seconds, the output signal in relation to the input illuminance is compressed so that 400% input brings about 100% output and the input from 400 to 1600% produces the output from 100 to 150%, respectively.

Figure 8:
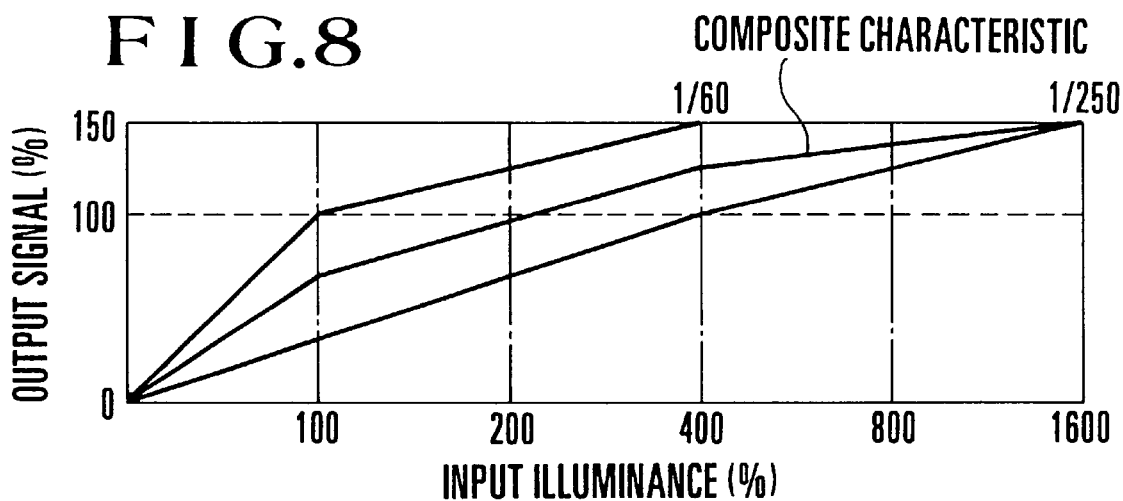
FIG. 8 illustrates an example of composite compression.

FIG. 8 illustrates compression characteristics obtained by combining a speed of 1/60 seconds used for performing dark image pickup and a speed of 1/250 seconds used for performing bright image pickup.

Figure 9:
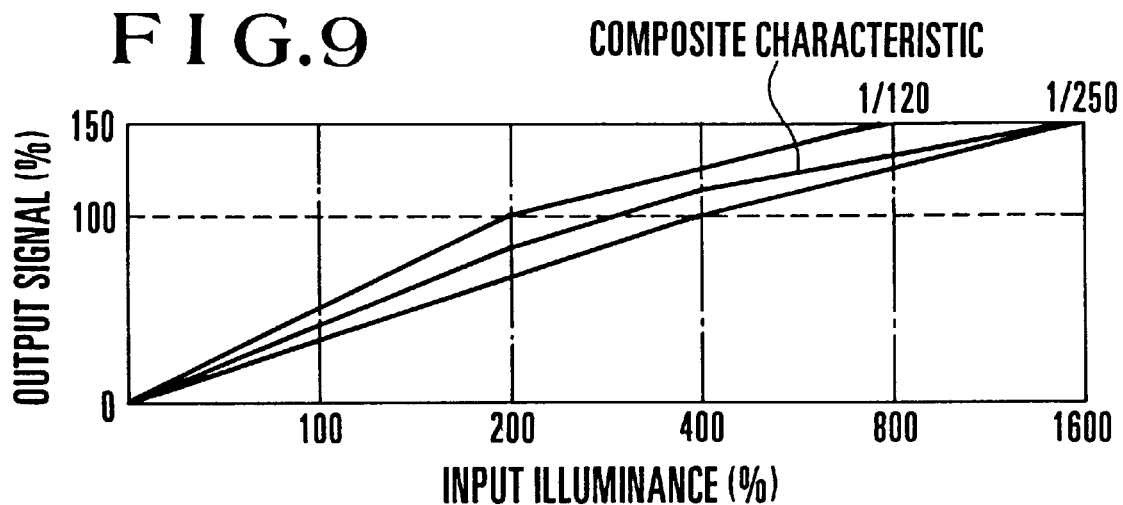
FIG. 9 illustrates another example of composite compression.

FIG. 9 illustrates compression characteristics obtained by combining a speed of 1/250 seconds similarly used for bright image pickup and a speed of 1/120 seconds used for dark image pickup, which is an increase of one stop.

FIGS. 8 and 9 clearly show that the two speeds are combined to obtain characteristics in which good gradation can be ensured for both bright and dark image pickup.

Figure 10:
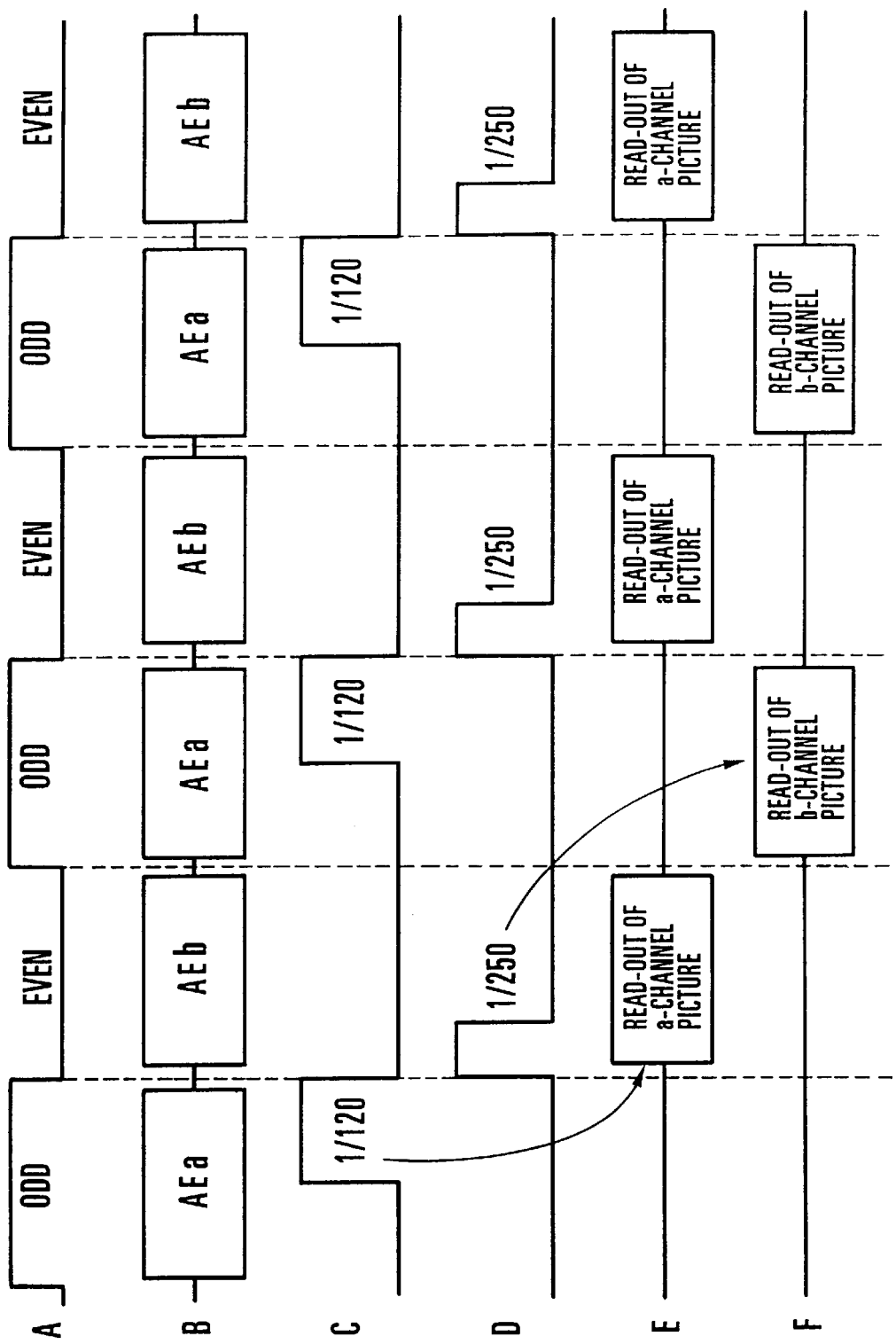
FIG. 10 is a timing chart of CCD processing according to the example of the composite compression.

FIG. 10 is a timing chart illustrative of CCD processing corresponding to the shutter-speed combination processing shown in FIG. 9.

The alphabets in FIG. 10 represents:

A: timing in the field cycle according to the NTSC method;

B: input signal switching timing of loops AEa and AEb of AE assigned for respectively achieving dark and bright image pickup in the respective odd-numbered and even-numbered line fields;

C: dark light accumulation period (approximately 1/120 seconds each);

D: bright light accumulation period (approximately 1/250 seconds each);

E: period of reading out a dark photoelectric conversion signal for one picture; and F: period of reading out a bright photoelectric conversion signal for one picture.

The interlaced reading performed by the CCD will now be explained.

Figure 19:
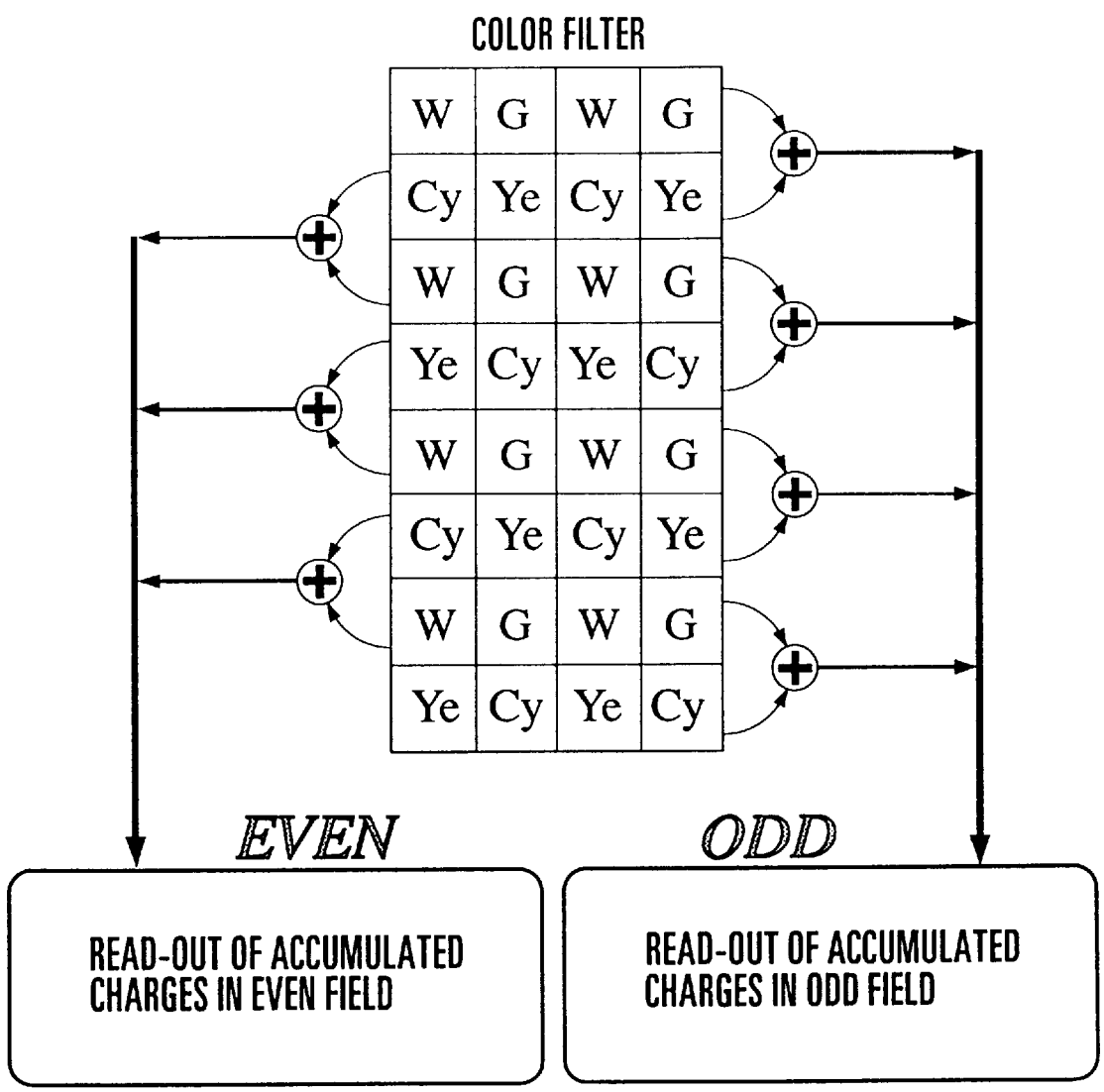
FIG. 19 illustrates two-line adding read-out processing by an image sensor.

FIG. 19 is a schematic view illustrative of processing by an image sensor in which interlaced reading is performed through the addition of two scanning lines.

An example will be given of a color sensor of a complementary color-type filter consisting of filter elements which are disposed on the respective light accumulation pixels. The color filter is a mosaic filter comprising colors, such as white, cyan, yellow and green (W, Cy, Ye and G). In this filter, it will now be assumed that the following relationships of colors are established: W=R+G+B, Cy=B+G, Ye=R+G, where R=red, G=green, and B=blue.

In the odd-numbered line field, a luminance signal can be obtained by allowing the output from the CCD image sensor to pass through a low-pass filter (LPF). The thus-obtained luminance signals can be expressed by the following equations in every horizontal line:

$$Yn=(W+Cy)+(G+Ye)=2R+4G+2B \quad (1)$$

$$Yn+1=(W+Ye)+(G+Cy)=2R+4G+2B \quad (2)$$

On the other hand, a chrominance signal can be obtained by the following process. The horizontal arrangement of the color filter elements is such that a combination of W and G (corresponding to two adjacent pixels) or a combination of Cy and Ye is repeated. Such a block of adjacent two pixels (W+G) is vertically added to another block of adjacent two pixels (Cy+Ye) so as to obtain vertical combinations of two signals (W+Cy) and (G+Ye). A difference between such two signals is calculated. The chrominance signals can thus be expressed by the following equations in every horizontal line:

$$Cn=(W+Cy)-(G+Ye)=2(B-G) \quad (1)$$

$$Cn+1=(W+Ye)-(G+Cy)=2(R-G) \quad (2)$$

In the even-numbered line field, both the luminance signal and the chrominance signal can be obtained in a manner similar to those in the odd-numbered line field. As shown in FIG. 19, a vertical combination of filter elements corresponding to adjacent two pixels is read out only in one horizontal line of the odd-numbered line filed so as to be shifted to a subsequent line, thereby performing pseudo interlaced reading. Similar processing applies to the even-numbered line field. Mg can be expressed by R+B. This interlaced reading method enhances a simple construction of a circuit but lowers the vertical resolution.

The non-interlaced reading performed by the CCD will now be described.

Figure 20:
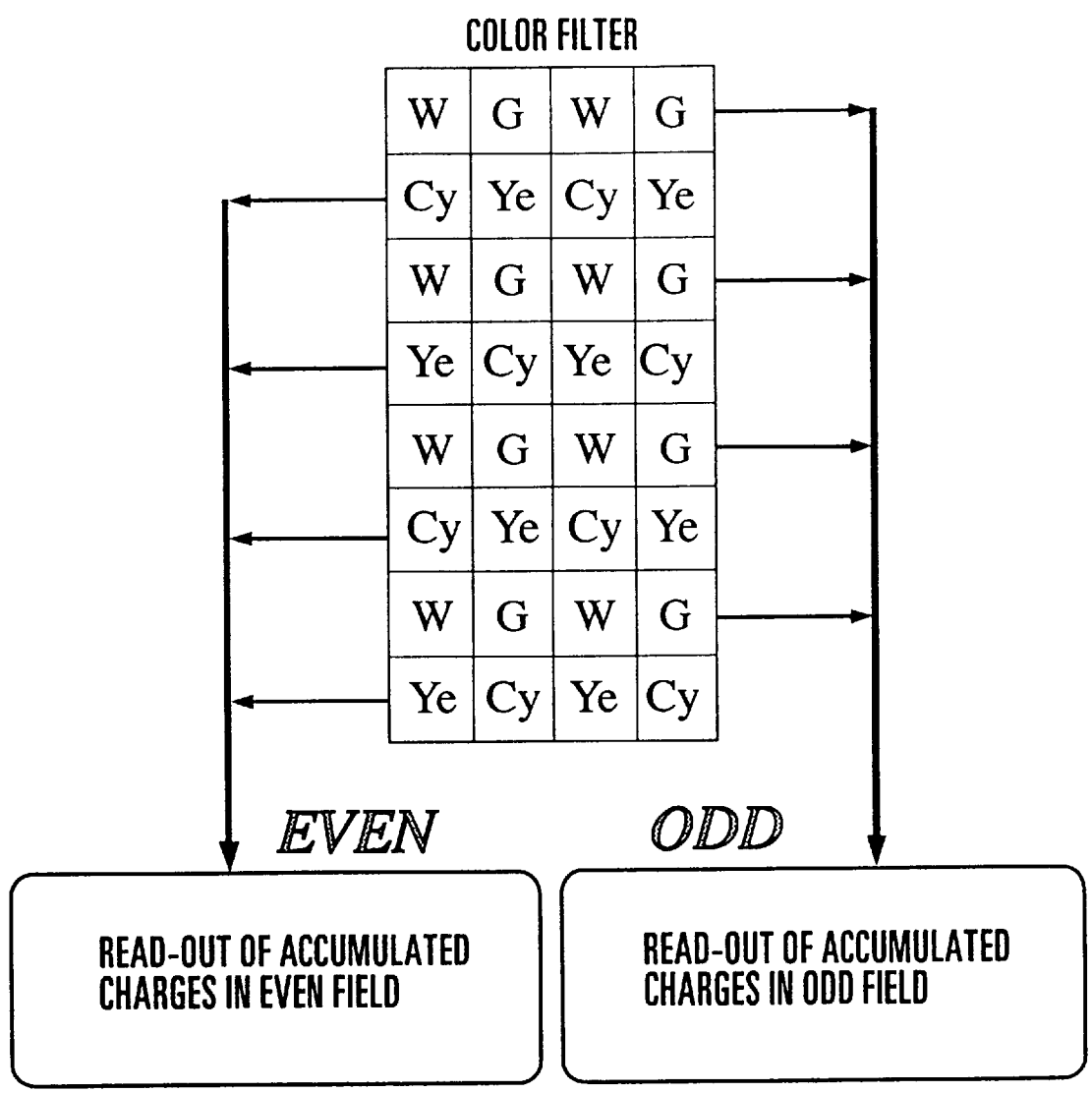
FIG. 20 illustrates two-line independent read-out processing by an image sensor.

FIG. 20 is a schematic view illustrative of processing by an image sensor in which non-interlaced reading is performed through independent reading of respective lines.

An example will be given of a color sensor of a complementary color-type filter consisting of filter elements which are disposed on the respective light accumulation pixels. The color filter is formed of a mosaic filter comprising colors, such as white, cyan, yellow and green (W, Cy, Ye and G). In this filter, it will now be assumed that the following relationships of colors are established: W=R+G+B, Cy=B+G, Ye=R+G, wherein R=red, G=green, and B=blue.

In the odd-numbered line field, a luminance signal can be obtained by allowing the output read by the CCD image sensor to pass through a low-pass filter (LPF). The thus-obtained luminance signal can be expressed by the following equations in every horizontal line:

$$Yn=(W+G)=R+2G+B \qquad (1)$$

$$Yn+1=(Cy+Ye)=R+2G+B \qquad (2)$$

A chrominance signal can be obtained by the following process. The horizontal arrangement of the color filter elements is such that a combination of W and G (corresponding to two adjacent pixels) and a combination of Cy and Ye is repeated. Such a block of adjacent two pixels (W+G) is independently read out in the first horizontal line. Then, another block of adjacent two pixels (Cy+Ye) is also independently read out in the second horizontal line. The thus-obtained signals are vertically added to obtain vertical combinations of signals (W+Cy) and (G+Ye) so as to calculate a difference between such two combinations. The chrominance signal can be expressed by the following equations in every horizontal line:

$$Cn=(W+Cy)-(G+Ye)=2(B-G) \qquad (1)$$

$$Cn+1=(W+Ye)-(G+Cy)=2(R-G) \qquad (2)$$

In the even-numbered line field, both the luminance signal and the chrominance signal can be obtained in a manner similar to those in the odd-numbered line field.

As shown in FIG. 20, signals in all the horizontal lines of the odd-numbered and even-numbered line fields are thus independently read out, thereby realizing non-interlaced reading. According to this non-interlaced reading method, since the information on all the 525 lines can be acquired for each field, a resultant image obtained by combining a plurality of fields also consists of 525 lines, thereby avoiding a deterioration in the vertical resolution.

Figure 21B:
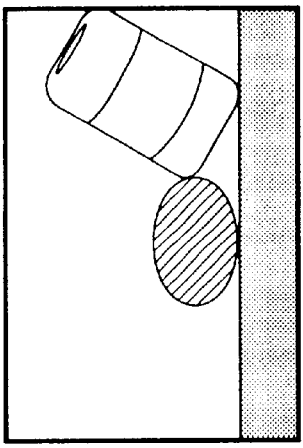
FIGS. 21(a), 21(b) and 21(c) illustrate interference by a moving object caused by an interlace reading method.
Figure 21C:
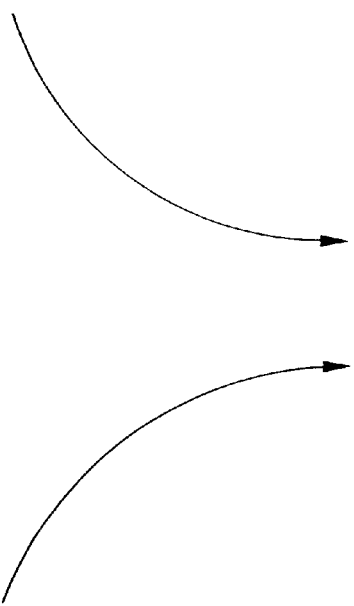
Figure 21A:
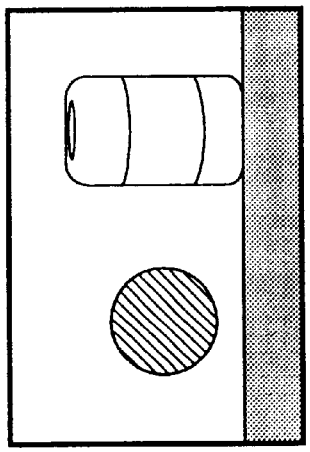
Figure 22:
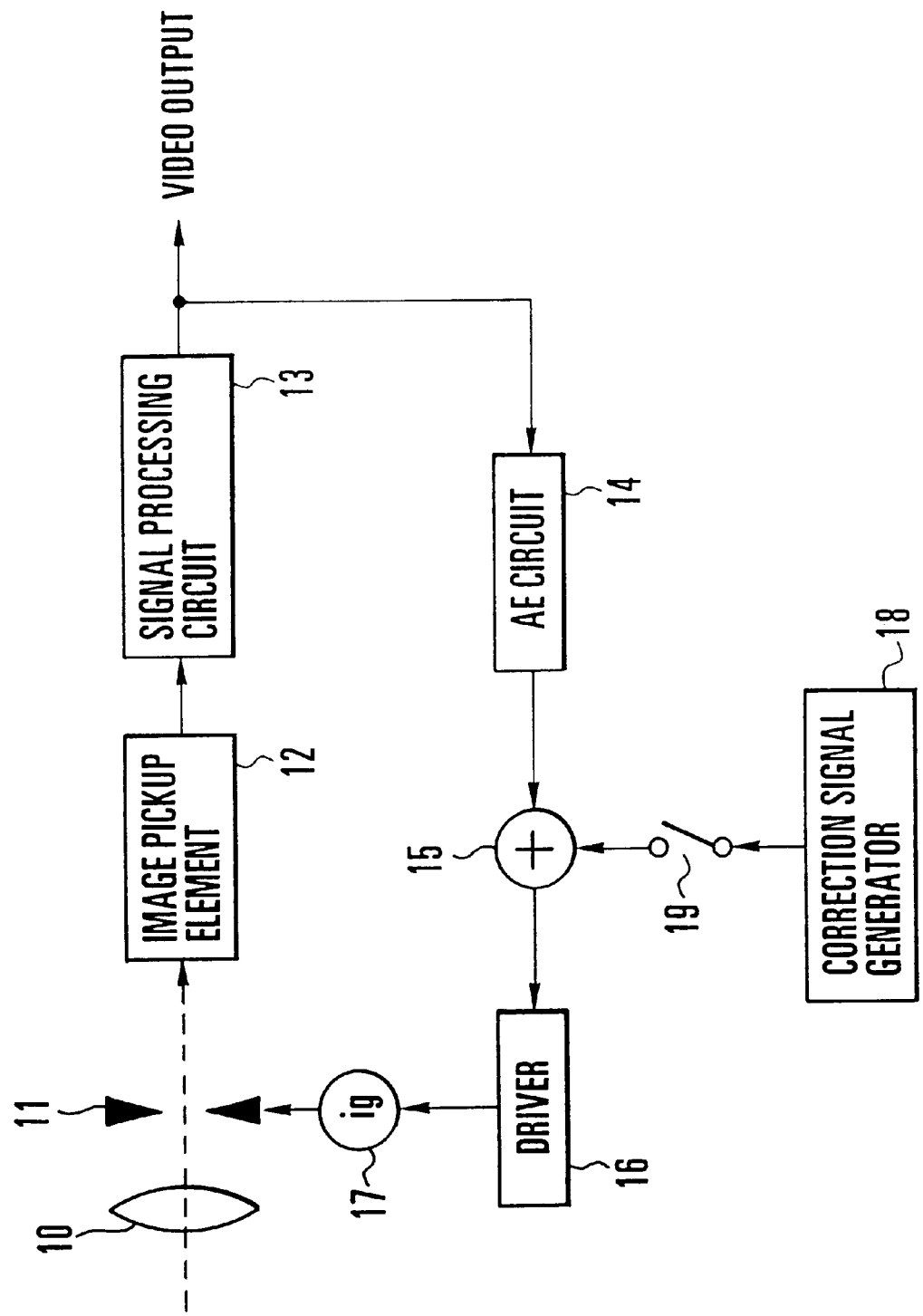
FIG. 22 is a block diagram illustrative of an exposure control mechanism used in a conventional image pickup apparatus.

The respective fields obtained by the interlaced reading method shown in FIGS. 21(a) and 21(b) are combined to obtain a resultant image illustrated in FIG. 21(c). The combined image clearly shows that the interlaced reading method causes displacements of the moving objects. The above-described non-interlaced reading method can effectively avoid such displacements.

Figure 11:
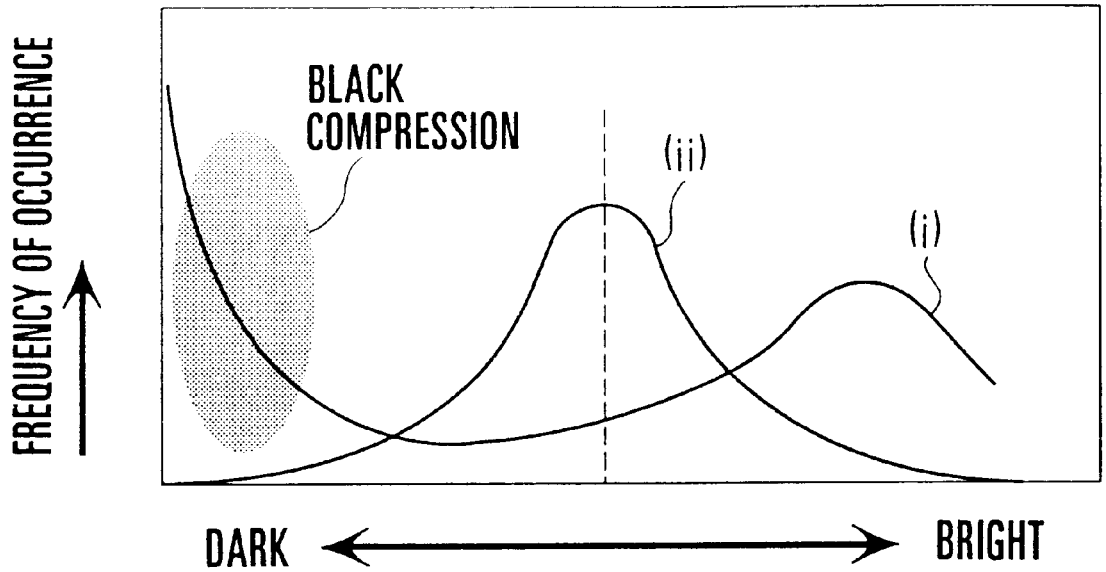
FIG. 11 illustrates a luminance histogram.
Figure 12:
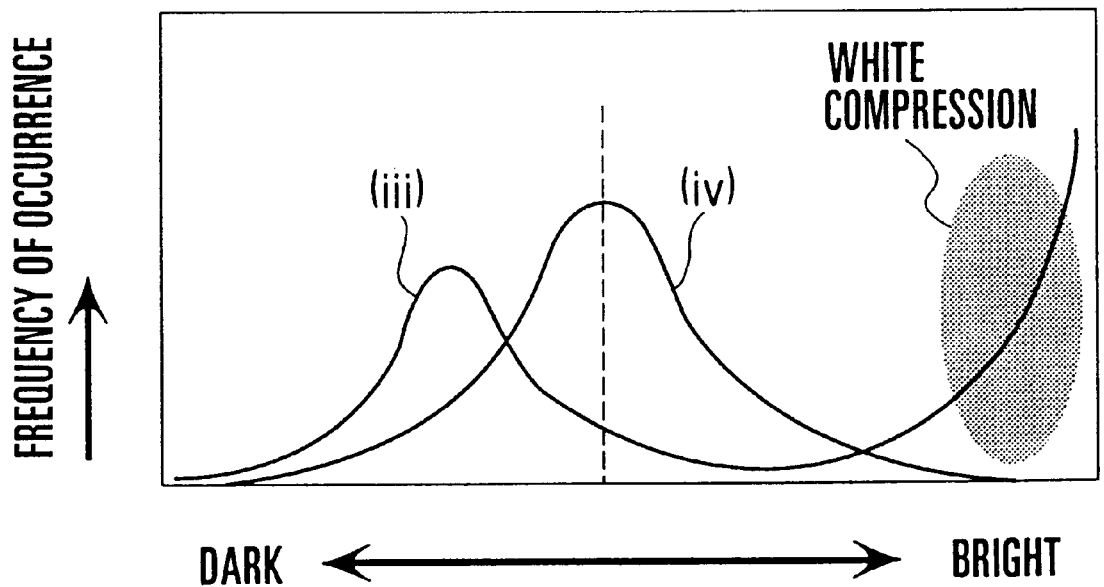
FIG. 12 illustrates a luminance histogram.

A description will now be given of the relationship between the effect of backlight compensation and the image analysis according to this embodiment with reference to FIGS. 11 and 12 illustrating examples of the luminance histogram.

A typical automatic exposure control mechanism for use in a video camera or the like controls an iris or other elements so that the integral of different luminance levels of a video signal for one picture approximates a predetermined value. This construction presents the following problem. Although a plurality of (two, in this case) pictures have different illuminance distributions, respectively, as indicated by curves (i) and (ii) of the luminance histogram shown in FIG. 11, they may have the same integral of the luminance signals on the overall picture. In which case, an iris is disadvantageously controlled in a similar manner for both pictures having different illuminance distributions. The curve (i) illustrates a distribution pattern of the frequency of the luminance which is likely to be produced while image pickup is performed on a backlighted object, whereas the curve (ii) indicates a distribution pattern of the frequency of the luminance which is likely to be produced while image pickup is performed on a frontlighted object.

For performing backlight compensation, the BLC-ON-MODE (backlight compensation mode) is selected by a mode change-over switch so as to turn the BLC switch ON, thus transforming the distribution pattern of the luminance from the curve (i) shown in FIG. 11 to the curve (iii) illustrated in FIG. 12. Because of this change, the image pickup signal suffering from "black compression" is raised to approximate the above-described predetermined value which will roughly achieve the overall suitable exposure. This further causes higher-luminance clipping in the bright image pickup signal, resulting in a distribution pattern of the luminance biased toward the brighter region.

Then, the "white compression" area of the curve (iii) shown in FIG. 12 is corrected to achieve suitable exposure by the non-linear processing of combining shutter speeds shown in FIGS. 7–9, thus substantially resulting in a picture similar to the one obtained by performing image pickup of a frontlighted object, as indicated by the curve (iv) illustrated in FIG. 12.

Consequently, in combination with the above-discussed picture analysis, the accumulation time is suitably controlled by the timing control circuits 110a and 110b shown in FIG. 1, thus enabling AE control in a wide dynamic range.

A description has thus been given of a method of performing the two types of exposure control processing for respective lower-luminance and higher-luminance areas, based on the overall information on one picture. A further explanation will be given of using video signals extracted from different areas in one picture to perform the above-described two types of exposure control processing.

Figures 5, 6:
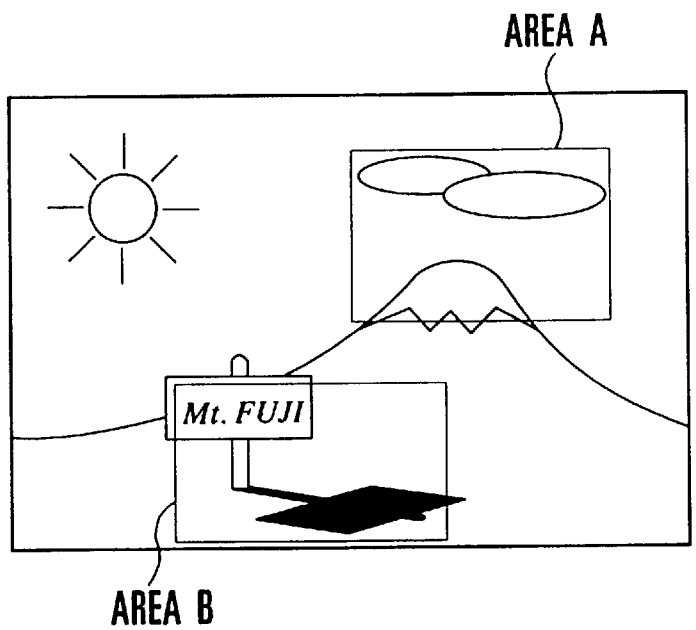
FIG. 5 illustrates an embodiment in which a light image region is divided into a plurality of areas.
FIG. 6 illustrates an image obtained by performing image pickup of the backlighted object upon an application of this image division.

FIG. 5 illustrates an embodiment in which an image is divided into a plurality of areas. In this embodiment, the image is divided into 64 equal areas consisting of vertical 8 times horizontal 8 areas. FIG. 6 illustrates an example of the image pickup of a backlighted object upon an application of this image division. An area A (consisting of divided blocks Nos. 13, 14, 15, 21, 22, 23, 29, 30 and 31) is selected to represent the higher luminance region, while an area B (consisting of divided blocks Nos. 43, 44, 45, 51, 52, 53, 59, 60 and 61) is selected to represent the lower luminance region. Although the areas A and B consist of the same number of nine blocks, they may be formed of different number of blocks, which should be compensated with a weight coefficient.

By use of the signals in these areas, exposure control is independently performed on the respective lower-luminance and higher-luminance regions, thereby enabling image pickup using the resultant video signal which is compressed into a suitable dynamic range in the overall picture.

The above-discussed embodiment in which exposure is controlled through use of the block division is constructed similarly to that of the circuit shown in FIG. 1. However, it differs from the previous embodiment in the function of the image analyzing circuit. That is, an image pickup signal is analyzed by the image analyzing circuit 107, such as the above-described luminance histogram analyzing means or the like, and several blocks of areas having a high frequency of the lower luminance and several blocks of areas having a high frequency of higher luminance are selected from the highest frequency order. Based on the video signals indicative of information on the several blocks in the respective areas, the image analyzing circuit 107 generates control signals corresponding to the areas A and B to turn the gates 108a and 108b ON or OFF.

By use of the video signals selected by the gates 108a and 108b, the exposure control circuits AE-1 (109a) and AE-2 (109b) respectively generate control signals to be transmitted to the subsequent timing generators 110a and 110b. In a simple example, the AE-1 (109a) is used to set the time t2 so as to realize a shutter speed suitable for a higher luminance region, while the AE-2 (109b) is used to achieve a shutter speed suitable for a lower luminance region. Although the simplest example has been explained herein, many other types of known AE methods are available to perform exposure control suitable for the higher and lower-luminance regions.

As is clearly seen from the foregoing description, the above-described embodiments of the present invention offers the following advantages.

A simple control processing circuit is merely added to a VOD-type CCD which is becoming dominant, thereby effectively improving a narrow dynamic range which is incurred during image pickup of a backlighted object and which is a serious problem during the video camera image pickup.

The thus-improved wider dynamic range is extremely effective since a background, which conventionally suffers from "white compression" as a result of backlight compensation and has not thus been able to be reproduced, can also be presented together with a main object.

For the compression of a wide range of gradations, higher luminance and lower luminance regions in one picture can be extracted and controlled by dividing the picture into a plurality of areas, thereby enabling the construction of a stable system. More specifically, when a gradation range in one picture is changed, for example, when light is turned on in the room during the image pickup of a person in the room and of the scenery over the window at the same time, the bright and dark ratio is narrowed. Thus, the time t2 is changed to vary the compression ratio, which disadvantageously entails a change in the tone of the scenery over the window on which no change has been actually made. However, in this embodiment, the system corresponding to the area B independently corrects the shutter speed of that corresponding to the area A in order to cope with such a change in the compression ratio. Such an independent control can inhibit a change in exposure corresponding to the area A, thus effectively making the overall change look as natural as possible.

Additionally, the highest luminance area is excluded from the automatic exposure control so that the unnatural picture resulting from the extreme compression of the gradation can be avoided.

Although the invention has been described in its preferred form, modification and variation may be made in the invention without departing from the spirit and scope thereof. For example, although two types of light accumulation time have been explained, three types may instead be employed. The invention may also be applied to other types of CCD in place of the vertical overflow drain (VOD) type.

What is claimed is:

1. An image pickup apparatus comprising:
   (a) an image pickup which converts an optical image into an electrical image signal;
   (b) a drive unit which operates to cause said image pickup to form a first image signal of a given photographic scene having a first accumulation time and to form a subsequent second image signal of the same photographic scene having a second accumulation time different from the first accumulation time;
   (c) a first accumulation time control unit which adjusts the first accumulation time on the basis of the first image signal;
   (d) a second accumulation time control unit which adjusts the second accumulation time on the basis of the second image signal subsequent to said first image signal;
   (e) a combining device which combines said first image signal of which first accumulation time is adjusted by said first accumulation time control unit, and said subsequent second image signal of which second accumulation time is adjusted by said second accumulation time control unit, to form a gradation controlled single image; and
   (f) an image signal analyzing circuit which analyzes said image signal and controls said first and second accumulation time control units.

2. An image pickup apparatus according to claim 1, wherein said image pickup has a single image pickup element, and said drive unit forms the first and second image signals by using said single image pickup element.

3. An image pickup apparatus, comprising:
   (a) an image pickup which converts an optical image into an electrical image signal;
   (b) a drive unit which operates in the course of the making of an individual object picture and causes said image pickup to form a first image signal having a first accumulation time and to form a subsequent second image signal having a second accumulation time different from the first accumulation time;
   (c) a first accumulation time control unit which adjusts the first accumulation time on the basis of the first image signal;
   (d) a second accumulation time control unit which adjusts the second accumulation time on the basis of the second image signal subsequent to said first image signal,
   wherein said image pickup has a plurality of separate image pickup elements and wherein the first and second image signals are formed from respective different image pickup elements;
   (e) a combining device which combines said first image signal of which first accumulation time is adjusted by said first accumulation time control unit, and said subsequent second image signal of which second accumulation time is adjusted by said second accumulation time control unit, to form a gradation controlled single image; and
   (f) an image signal analyzing circuit which analyzes said image signal and controls said first and second accumulation time control units.

4. An image pickup apparatus comprising:
   (a) an image pickup which converts an optical image into an electrical image signal;

(b) a drive unit which operates in the course of the making of an individual object picture and causes said image pickup to form a first image signal of a given photographic scene having a first exposure condition and to form a subsequent second image signal of the same photographic scene having a second exposure condition different from the first exposure condition;

(c) a first exposure condition control unit which adjusts the first exposure condition on the basis of the first image signal;

(d) a second exposure condition control unit which adjusts the second exposure condition on the basis of the second image signal subsequent to said first image signal;

(e) a combining device which combines said first image signal of which first exposure condition is adjusted by said first exposure condition control unit, and said subsequent second image signal of which second exposure condition is adjusted by said second exposure condition control unit, to form a gradation controlled single image; and (f) an image signal analyzing circuit which analyzes said image signal and which controls said first and second exposure condition control units.

5. An image pickup apparatus according to claim 4, wherein said image pickup has a single image pickup element, and said drive unit forms the first and second image signals by using said single image pickup element.

6. An image pickup apparatus according to claim 4, wherein each of the first and second exposure conditions includes accumulation time.

7. An image pickup apparatus, comprising:

(a) an image pickup which converts an optical image into an electrical image signal;

(b) a drive unit which operates in the course of the making of an individual object picture and causes said image pickup to form a first image signal of a given photographic scene having a first accumulation time and to form a subsequent second image signal of the same photographic scene having a second accumulation time different from the first accumulation time;

(c) a first accumulation time control unit which adjusts the first accumulation time on the basis of the first image signal;

(d) a second accumulation time control unit which adjusts the second accumulation time on the basis of the second image signal subsequent to said first image signal, wherein said image pickup has a plurality of separate image pickup areas within a light sensing surface of said image pickup and wherein the first and second image signals are formed from respective different image pickup areas;

(e) a combining device which combines said first image signal of which first accumulation time is adjusted by said first accumulation time control unit, and said subsequent second image signal of which second accumulation time is adjusted by said second accumulation time control unit, to form a gradation controlled single image; and (f) an image signal analyzing circuit which analyzes said image signal and controls said first and second accumulation time control units.

* * * * *